(12) United States Patent
Sakurai

(10) Patent No.: US 11,464,104 B2
(45) Date of Patent: Oct. 4, 2022

(54) WIRING SUBSTRATE

(71) Applicant: KYOCERA Corporation, Kyoto (JP)

(72) Inventor: Keizou Sakurai, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/981,312

(22) PCT Filed: Jan. 24, 2019

(86) PCT No.: PCT/JP2019/002186
§ 371 (c)(1),
(2) Date: Sep. 16, 2020

(87) PCT Pub. No.: WO2019/181187
PCT Pub. Date: Sep. 26, 2019

(65) Prior Publication Data
US 2021/0014960 A1 Jan. 14, 2021

(30) Foreign Application Priority Data
Mar. 20, 2018 (JP) .............................. JP2018-053127

(51) Int. Cl.
| H05K 1/11 | (2006.01) |
| H05K 1/14 | (2006.01) |
| H05K 9/00 | (2006.01) |
| H01L 23/13 | (2006.01) |
| H01L 23/31 | (2006.01) |
(Continued)

(52) U.S. Cl.
CPC ......... *H05K 1/0242* (2013.01); *H01Q 1/2283* (2013.01)

(58) Field of Classification Search
CPC .............. H05K 1/0242; H05K 1/0271; H05K 2201/09063; H05K 2201/09081; H05K 2201/10719; H05K 2201/10098; H05K 1/144; H05K 1/0237; H05K 1/11; H05K 1/14; H05K 1/111; H05K 1/115; H05K 1/181; H05K 1/186; H05K 1/0216;
(Continued)

(56) References Cited

U.S. PATENT DOCUMENTS 9,632,105 B2 * 4/2017 Yoshiuchi .......... G01C 19/5769
10,985,138 B2 * 4/2021 Kang .................. H01L 25/0657
(Continued)

FOREIGN PATENT DOCUMENTS

JP  63-125003 A   5/1988
JP  63125003   *  5/1988
(Continued)

*Primary Examiner* — Xiaoliang Chen
(74) *Attorney, Agent, or Firm* — Volpe Koenig

(57) ABSTRACT

A wiring substrate comprises a first substrate, a second substrate which includes a frame body located on the outer circumferential edge of the first substrate, at least two connecting parts connected to the inner circumferential part of the frame body, and a support body connecting the two connecting parts to each other, and a third substrate located on a surface of the second substrate opposite the first substrate. The support body includes a direction changing part between the two connecting parts and does not include an annular structure where the direction changing part is included on the circumference.

19 Claims, 5 Drawing Sheets

(51) Int. Cl.
*H01L 23/552* (2006.01)
*H05K 1/02* (2006.01)
*H01Q 1/22* (2006.01)

(58) Field of Classification Search
CPC ...... H05K 3/4697; H05K 9/00; H01Q 1/2283; H01L 23/13; H01L 23/31; H01L 23/552
USPC ................................. 174/261, 377; 361/753
See application file for complete search history.

(56) References Cited

U.S. PATENT DOCUMENTS

| | | | | |
|---|---|---|---|---|
| 11,133,591 | B2* | 9/2021 | Yamamoto | ............... H01Q 7/00 |
| 2005/0127818 | A1* | 6/2005 | Ohtani | ................ H01L 51/5243 |
| | | | | 313/500 |
| 2006/0151614 | A1* | 7/2006 | Nishizawa | ....... G06K 19/07732 |
| | | | | 235/492 |
| 2009/0067141 | A1* | 3/2009 | Dabov | .................... H01Q 1/42 |
| | | | | 361/753 |
| 2013/0050227 | A1 | 2/2013 | Petersen et al. | |
| 2014/0048326 | A1* | 2/2014 | Lin | ...................... H05K 1/0216 |
| | | | | 174/377 |
| 2014/0145891 | A1* | 5/2014 | Palevsky | .............. H01Q 9/0435 |
| | | | | 343/746 |
| 2015/0221599 | A1* | 8/2015 | Fujii | .................... H01Q 1/2283 |
| | | | | 257/690 |
| 2016/0211828 | A1* | 7/2016 | Simmonds | ........... G02B 6/1225 |
| 2018/0046283 | A1* | 2/2018 | Yoshida | ................... G06F 3/0446 |
| 2019/0082534 | A1* | 3/2019 | Hoang | .................. H05K 1/181 |

FOREIGN PATENT DOCUMENTS

| | | |
|---|---|---|
| JP | 2000-138525 A | 5/2000 |
| JP | 2017-028245 A | 2/2017 |
| TW | 201323316 A1 | 6/2013 |

* cited by examiner

WIRING SUBSTRATE

TECHNICAL FIELD

The present disclosure relates to a wiring substrate.

BACKGROUND ART

Conventionally, a wiring substrate is used as an antenna for transmitting and receiving electromagnetic waves for signals. A wiring substrate for an antenna is used for wireless communication between electronic devices and obstacle detection devices for vehicles. Such a wiring substrate has, for example, a circuit board including an antenna circuit, a ground conductor plate including a ground conductor layer, and a frame body including a pier on the inner circumferential part. The frame body is located between the circuit board and the ground conductor plate in the state that the antenna circuit and the ground conductor layer face each other. In such a circuit board, an air layer is provided between the antenna circuit and the ground conductor layer. (See Patent Document 1).

PRIOR ART DOCUMENTS

Patent Documents

Patent Document 1: Japanese Unexamined Patent Publication No. S63-125003

SUMMARY OF THE INVENTION

The wiring substrate of the present disclosure includes a first substrate, a second substrate including a frame body located at an outer circumferential edge of the first substrate, at least two connecting parts connected to an inner circumferential part of the frame body, and a support body connecting the two connecting parts to each other, and a flat plate third substrate located on a top surface of the second substrate. The support body includes a direction changing part between the two connecting parts and does not include an annular structure where the direction changing part is included on the circumference.

EMBODIMENTS FOR CARRYING OUT THE INVENTION

Figure 1:
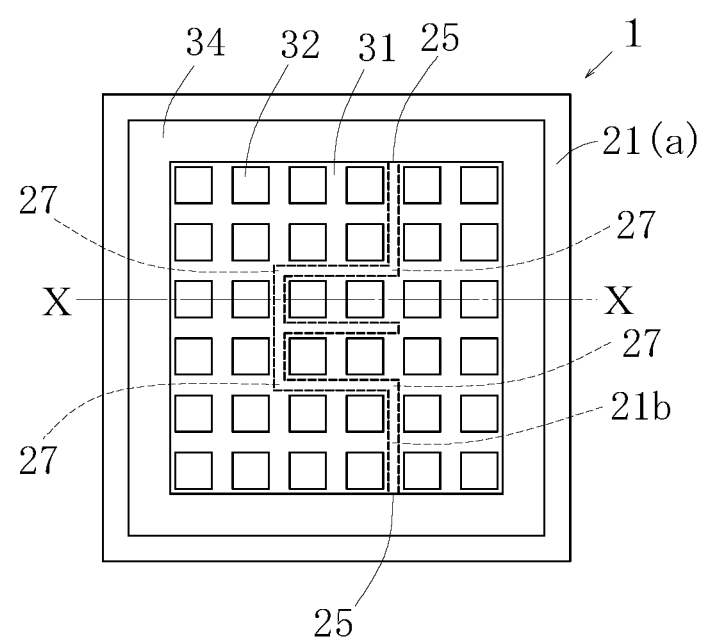
FIG. 1 is a schematic plan view showing an example of an embodiment of the wiring substrate of the present disclosure.
Figure 2:
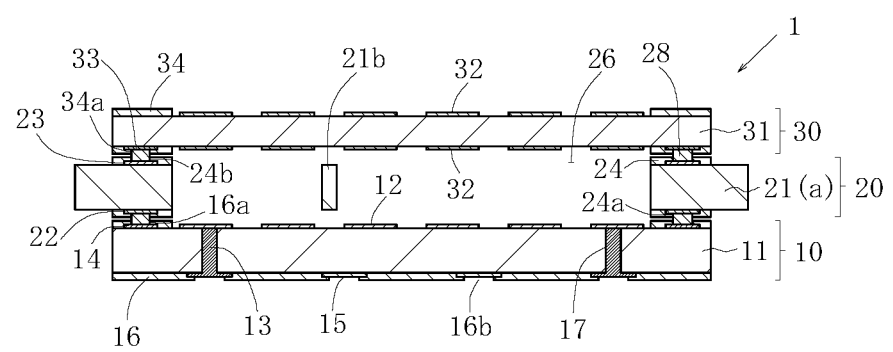
FIG. 2 is a schematic sectional view between X and X shown in FIG. 1.

Next, an example of an embodiment regarding the wiring substrate of the present disclosure will be described based on FIGS. 1 and 2. FIG. 1 is a schematic plan view from the side of third substrate that configures the wiring substrate of the present disclosure. FIG. 2 is a schematic sectional view passing between X and X shown in FIG. 1.

A wiring substrate 1 includes a first substrate 10, a second substrate 20 and a third substrate 30. As shown in FIG. 2, in the wiring substrate 1, the second substrate 20 and the third substrate 30 are sequentially stacked above the first substrate 10.

The first substrate 10 and the third substrate 30 may be, for instance, in the form of a flat plate. The first substrate 10 and the third substrate 30 have a first antenna conductor 12 and a second antenna conductor 32, respectively. A void is formed between the first substrate 10 and the third substrate 30, for example, depending on the thickness of the second substrate 20. The second substrate 20 has a shape including a frame body.

The first substrate 10 includes, for instance, a first insulating layer 11, a first antenna conductor 12, a wiring conductor 13, a first pad 14, an electrode 15, and a solder resist 16. The first substrate 10 is in a rectangular shape. The first substrate 10, for example, has a length of 10 mm to 120 mm on one side and a thickness of 100 μm to 800 μm.

The first insulating layer 11 includes, for instance, glass cloth and may also include at least one type of thermosetting resin, such as an epoxy resin or a bismaleimide triazine resin.

The first insulating layer 11 is formed in the form of a flat plate by pressing a prepreg impregnated with a thermosetting resin such as an epoxy resin or a bismaleimide triazine resin in glass cloth under heat.

The first insulating layer 11 has a plurality of through holes 17 that penetrates between the upper surface (the side of the first antenna conductor 12) and the lower surface (the side of the electrode 15). The through holes 17 have circular openings in plan view, for instance, on the upper and lower surfaces of the first insulating layer 11. The through holes 17 are formed by drilling, blasting or laser machining, for instance.

A plurality of first antenna conductors 12 is located on the upper surface of the first insulating layer 11, for example, spaced apart in the vertical and horizontal directions, respectively. The plurality of first antenna conductors 12 opposes each of the second antenna conductors 32 on the surface of a third insulating layer 31, as described later.

The first antenna conductor 12 includes a metal, such as copper, for example. The first antenna conductor 12 is formed using a plating technique such as a semi-additive or subtractive method.

The wiring conductor 13 is located on the lower surface of the first insulating layer 11 and within the through holes 17. A part of the wiring conductor 13 is connected to the first antenna conductor 12.

The wiring conductor 13 includes a metal, such as copper, for instance. The wiring conductor 13 is formed using a plating technique such as a semi-additive or subtractive method.

The first pad 14 is located on the outer circumferential edge of the upper surface of the first insulating layer 11. The first pad 14 includes a metal, such as copper, for example. The first pad 14 is formed using a plating technique such as a semi-additive or subtractive method.

The electrode 15 is located on the lower surface of the first insulating layer 11 (outermost surface of the wiring substrate 1). The electrode 15 is connected to the electrodes of an external electric substrate via solder. This allows the wiring substrate 1 to be electrically connected to the external electric substrate. The electrode 15 includes a metal, such as copper, for instance. The electrode 15 is formed by using a plating technique such as a semi-additive or subtractive method. Manufacturing efficiency is improved, when the first antenna conductor 12, the wiring conductor 13, the first pad 14 and the electrode 15 are formed simultaneously by the above method.

The solder resist 16 is located on a part of the upper and lower surfaces of the first insulating layer 11. The solder resist 16 has an opening 16a that exposes the first pad 14. The solder resist 16 has an opening 16b that exposes the electrode 15.

The solder resist 16 is formed in a predetermined pattern by applying, for example, a photosensitive thermosetting resin such as an acrylic-modified epoxy resin to the upper and lower surfaces of the first insulating layer 11 and exposing and developing the resin.

The second substrate 20 is located on the upper surface of the first substrate 10. The second substrate 20 includes a second insulating layer 21, a second pad 22, a third pad 23, and a solder resist 24.

The second insulating layer 21 includes, for instance, glass cloth, and also includes a thermosetting resin such as an epoxy resin or a bismaleimide triazine resin. The second insulating layer 21 has a frame body 21a and a support body 21b.

The frame body 21a is framed, for example, having a square inner and outer circumferences in plan view. The ends of the support body 21b are connected to two sides of the frame body 21a that are different from each other. The inside of the frame body 21a may be divided into a plurality of areas by the support body 21b. The frame body 21a is located so as to protrude on the outer circumferential edge of the first substrate 10 in top view.

The frame body 21a has two connecting parts 25 on the inner circumferential part and is connected to the support body 21b. The area surrounded by the inner circumferential part of the frame body 21a and the support body 21b is a void where the second insulating layer 21 does not exist. With the second substrate 20 interposed by the first substrate 10 and the third substrate 30, this void constitutes the cavity 26.

The length of one side on the outer circumferential side of the frame body 21a is, for instance, 20 mm to 150 mm, and the thickness is 50 μm to 1000 μm. The length of one side of the frame body 21a is preferably 3 mm to 10 mm larger than the length of one side of the first substrate 10. This allows the rigidity of the frame body 21a to be increased. When miniaturizing the wiring substrate 1, the length of one side of the frame body may be aligned with the length of one side of the first substrate 10.

The support body 21b has a belt-like shape and connects the two connecting parts 25 to each other. The support body 21b is located between the first antenna conductors 12 which are adjacent to each other in plan view. In plan view, there is no overlap between the support body 21b and the first antenna conductor 12. The support body 21b has the function of a supporting part suppressing deformation of the first substrate 10 and the third substrate 30 and preventing contact between the first substrate 10 and the third substrate 30 in the wiring substrate 1. In the absence of the support body 21b, at least one of the first substrate 10 and the third substrate 30 is deformed and enters the above void, resulting in contact between the first substrate 10 and the third substrate 30.

As shown in FIG. 1, the support body 21b has four direction changing parts 27 between the two connecting parts 25. In the case of this example, the support body 21b is turned 90 degrees in the direction changing part 27. The support body 21b is not limited to a linear shape extending in one direction only. The support body 21b can support the first substrate 10 and the third substrate 30 in multiple directions.

The directions to be changed by the direction changing part 27 are, for example, directions that intersect each other at 90 degrees. In the example shown in FIG. 3, one support body 21b includes a plurality of direction changing parts 27, each of which changes direction by 90 degrees. In the example shown in FIG. 3, the connecting part 25 between the support body 21b and the frame body 21a is located at two side portions of the square frame body 21a that are opposed to each other.

Figure 3:
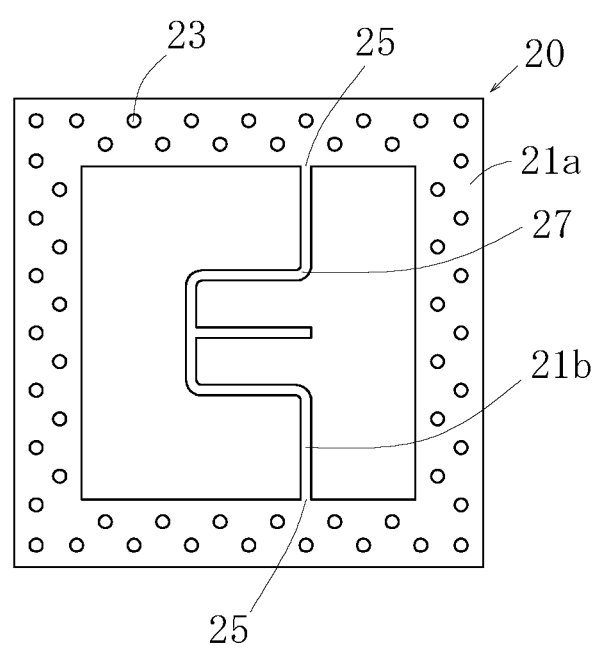
FIG. 3 is a schematic plan view showing another embodiment example in a main part of the wiring substrate of the present disclosure.

In the example shown in FIG. 3, a closed shape (annular structure) is composed of the frame body 21a and the support body 21b in plan view. The annular structure in which the direction changing part 27 is included on the circumference refers to, for instance, a closed structure such as a square shape configured only by the support body 21b. The support body 21b does not have the annular structure in which the direction changing part 27 is included on the circumference. This means that the support body 21b alone does not constitute the annular structure.

The support body 21b has an elastic structure in which the direction changing part 27 is a bending point between the connecting parts 25. As a result, when residual stresses during processing or thermal stresses due to heat dissipation of the electronic device are applied to the support body 21b, the direction changing part 27 disperses the stresses. Therefore, it is possible to mitigate the deformation amount of the support body 21b and to suppress the deformation of the wiring substrate 1.

The frame body 21a and support body 21b are formed, for example, by routing the second insulating layer 21 at positions corresponding to the inner circumference of the frame body 21a and the side of the support body 21b in the second insulating layer 21 and removing the second insulating layer 21. The width of the frame body 21a is, for instance, 0.5 mm to 10 mm. The width of the support body 21b is, for example, 0.5 mm to 5 mm.

The second pad 22 opposes the first pad 14 at the outer circumferential edge of the lower surface of the second insulating layer 21. The second pad 22 includes a metal, such as copper. The second pad 22 is formed by using a plating technique such as a semi-additive or subtractive method. The second pad 22 is connected to the first pad 14, for example, via solder 28. Thereby, the second substrate 20 is fixed on the first substrate 10. The first pad 14 and the second pad 22 may be physically or electrically connected to the first substrate 10 and the second substrate 20.

The third pad 23 is located on the outer circumferential edge of the upper surface of the second insulating layer 21. The third pad 23 includes a metal, such as copper. The third pad 23 is formed by using a plating technique such as a semi-additive or subtractive method. The manufacturing efficiency is improved, when the second pad 22 and the third pad 23 are formed simultaneously by the above method.

The solder resist 24 is located on a part of the upper and lower surface of the second insulating layer 21. The solder resist 24 has an opening 24a that exposes the second pad 22. The solder resist 24 has an opening 24b that exposes the third pad 23.

The third substrate 30 is located on the upper surface of the second substrate 20 (the surface opposite to the first substrate 10) to cover the area (void) surrounded by the inner circumferential part of the frame body 21a and the support body 21b. As a result, the second substrate 20 is sandwiched between the first substrate 10 and the third substrate 30, and the void constitutes the cavity 26. The third substrate 30 includes a third insulating layer 31, a second antenna conductor 32, a fourth pad 33, and a solder resist 34.

The third insulating layer 31 includes, for example, glass cloth and includes a thermosetting resin such as an epoxy resin or a bismaleimide triazine resin.

The third insulating layer 31 is formed in the form of a flat plate by pressing a prepreg impregnated with a thermosetting resin such as epoxy resin or bismaleimide triazine resin in glass cloth under heating.

The second antenna conductor 32 is located on the upper surface (the surface opposite to the second substrate 20) and the lower surface (the surface on the side of the second substrate 20) of the third insulating layer 31, for example, spaced in the vertical and horizontal directions, respectively. In plan view, the second antenna conductor 32 overlaps the upper and lower surfaces of the third insulating layer 31. The second antenna conductor 32 opposes the first antenna conductor 12 with the air layer in the cavity 26 interposed therebetween. In this example, the plurality of second antenna conductors 32 on the upper surface of the third insulating layer 31, the plurality of second antenna conductors 32 on the lower surface, and the first antenna conductor 12, which are opposed to each other, are formed with the same shape and the same size.

The second antenna conductor 32 includes a metal, such as copper. The second antenna conductor 32 is formed by using a plating technique such as a semi-additive or subtractive method.

The fourth pad 33 is located opposite the third pad 23 at the outer circumferential edge of the lower surface of the third insulating layer 31. The fourth pad 33 includes a metal, such as copper. The fourth pad 33 is formed by using a plating technique such as a semi-additive or subtractive method. The fourth pad 33 is connected to the third pad 23, for example, via solder 28. As a result, the third substrate 30 is fixed on the second substrate 20.

Figure 6:
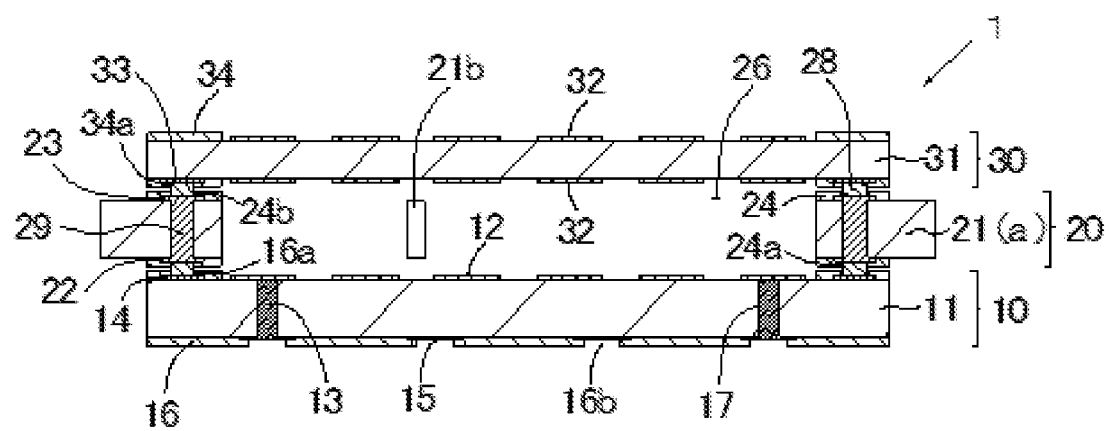
FIG. 6 is another embodiment showing a schematic sectional view between X and X shown in FIG. 1.

The third pad 23 and the fourth pad 33 may be physically or electrically connected to the second substrate 20 and the third substrate 30. For example, as shown in FIG. 6, the second substrate 20 is provided with a through hole conductor 29 connecting to the second pad 22 and the third pad 23, and it is possible to electrically connect the first substrate 10, the second substrate 20 and the third substrate 30, respectively.

The solder resist 34 is located on a part of the upper and lower surfaces of the third insulating layer 31. The solder resist 34 has an opening 34a that exposes the fourth pad 33.

The wiring substrate 1 used for such an antenna application has the following functions, for example.

First, the signal transmitted from the external electrical substrate is transmitted to the first antenna conductor 12 via the electrode 15 and the wiring conductor 13.

Next, the first antenna conductor 12, which receives the signal supply, radiates the electromagnetic waves.

The electromagnetic waves then propagate through the air layer in the cavity 26 to the second antenna conductor 32 on the lower surface side of the third insulating layer 31 and to the second antenna conductor 32 on the upper surface side.

The second antenna conductor 32 on the upper surface side radiates electromagnetic waves to the outside. Alternatively, the second antenna conductor 32 has a function of transmitting electromagnetic waves received from the outside as a signal to the external electrical substrate by following the reverse route to the above.

For this reason, in the wiring substrate 1, the frame body 21a and support body 21b, which constitute the cavity 26, are required to be located outside of the outer circumference of the first antenna conductor 12 to secure a path for the transmission and reception of electromagnetic waves. In the wiring substrate 1, the distance between the first antenna conductor 12 and the second antenna conductor 32 is maintained at a constant level to enable stable transmission and reception of electromagnetic waves between them.

The distance between the first antenna conductor 12 and the second antenna conductor 32 can be adjusted to an optimum distance for sending and receiving electromagnetic waves for signals by adjusting the thickness of the second insulating layer 21.

The connection of the first substrate 10, the second substrate 20 and the third substrate 30 is performed, for example, as follows.

First, the solder 28 is welded to at least one of the first pad 14 and the second pad 22, and at least one of the third pad 23 and the fourth pad 33.

Next, the second substrate 20 is placed on the first substrate 10 and the third substrate 30 is placed on the second substrate 20, while the first pad 14 and the second pad 22 are facing each other as well as the third pad 23 and the fourth pad 33.

Then, the solder 28 is melted by the reflow treatment and cooled and fixed. This connects the first substrate 10, the second substrate 20 and the third substrate 30 with solder 28.

If it is desired to further ensure airtightness in the cavity 26 or to improve the connection strength between the first substrate 10, the second substrate 20, and the third substrate 30, a resin may be filled in the gap of the connection between the first substrate 10 and the second substrate 20 and the gap of the connection between the second substrate 20 and the third substrate 30.

As shown in FIG. 1, in the wiring substrate 1 of the present disclosure, the support body 21b has four direction changing parts 27 between the two connecting parts 25, and does not have an annular structure where the direction changing parts 27 are included on the circumference.

The support body 21b has an elastic structure in which the direction changing parts 27 are the bending points between the connecting parts 25. This allows the stresses to be dispersed to each direction changing parts 27, even if residual stresses during processing or thermal stresses due to heat dissipation of the electronics are applied to the support body 21b. Therefore, it is possible to mitigate the deformation amount of the support body 21b and to suppress the deformation of the wiring substrate 1.

As a result, for example, when the wiring substrate 1 is used for an antenna application, it is possible to provide the wiring substrate 1 that enables stable transmission and reception of electromagnetic waves between the first antenna conductor 12 and the second antenna conductor 32 by maintaining a constant distance between them.

Although the wiring substrate in accordance with the embodiments of the present disclosure has been described above, it is not limited to an example of the above-described embodiments, and various improvements and modifications can be made within the scope of the claims. In FIGS. 1 and 2 above, the support body 21b is shown in a linear shape, but as shown in FIG. 3, the direction changing part 27 may have a curved shape. If the direction changing part 27 has a curved shape, stresses are applied to the entire curved portion of the direction changing part 27. As a result, the stresses can be dispersed and the damage to the direction changing part 27 can be more suppressed.

Figure 4:
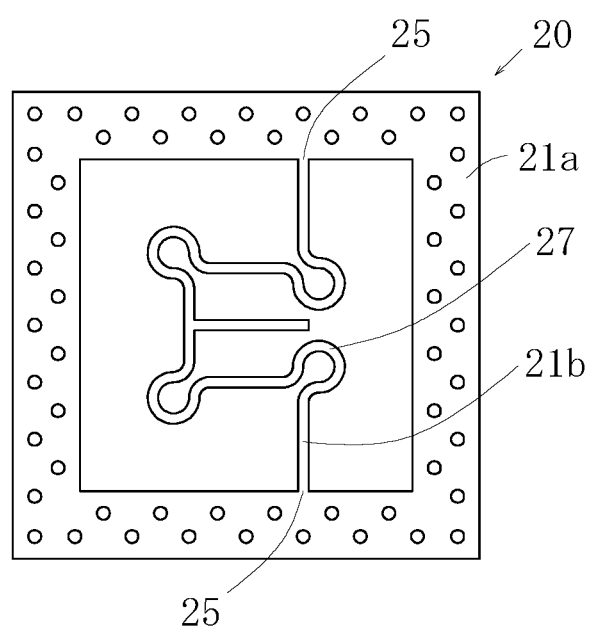
FIG. 4 is a schematic plan view showing another embodiment example in a main part of the wiring substrate of the present disclosure.

As shown in FIG. 4, the direction changing part 27 may have a bag shape. In this case, the stresses applied to the direction changing part 27 can be more efficiently dispersed due to the elasticity of the bag-shaped portion. This makes it possible to better suppress the damage to the direction changing part 27 due to large stresses.

For instance, if the frame body 21*a* is a square frame shape having a pair of sides facing each other, as in each of the examples shown in FIGS. 3 to 4, the two connecting parts 25 may be located separately on a pair of sides of the frame body 21*a*. A plurality of direction changing parts 27 may be located between the two connecting parts 25.

Figure 5:
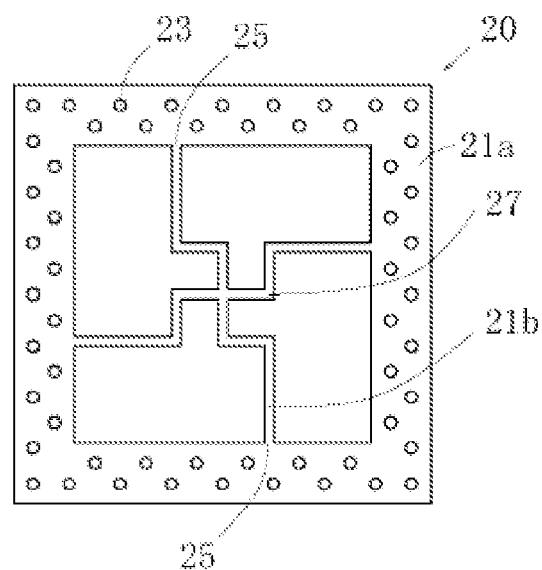
FIG. 5 is a schematic plan view showing another embodiment example in a main part of the wiring substrate of the present disclosure.

FIG. 5 is an example of a form having two connecting parts 25 located at the intersection of each other. In the above configuration, the deformation of the first substrate 10 and the third substrate 30 between a pair of sides opposed to each other can be suppressed while maintaining sufficient void in the frame body 21*a* to function as an antenna. In other words, it is possible to make a wiring substrate for an antenna with excellent electromagnetic radiation characteristics.

In one example of the above-described embodiment, the connecting parts 25 in the frame body 21*a* are located separately on a pair of opposing sides, but as shown in FIG. 5, the connecting parts 25 in the frame body 21*a* may be located separately on two opposing sides. In this case, the deformation amount of the wiring substrate 1 can be suppressed more evenly by the support body 21*b*, which is connected to the connecting parts 25 located on the two pairs of sides, respectively.

As described above, according to the wiring substrate of the present disclosure, a wiring substrate with small deformation can be provided. Therefore, it is effective for application to the wiring substrate that may be deformed by thermal stress caused by the heat dissipation of electronic devices. This is especially effective for application to the wiring substrate where many antenna circuits are located at high density due to the increased functionality and miniaturization of electronic devices and sensing devices.

The present disclosure is not limited to the application of one example in the above embodiments. The wiring conductors for signal transmission may also be located.

DESCRIPTION OF THE REFERENCE NUMERALS

1 Wiring Substrate
10 First Substrate
11 First Insulating Layer
12 First Antenna Conductor
13 Wiring Conductor
14 First Pad
15 Electrode
16 Solder Resist
16*a*, 16*b* Opening
17 Through hole
20 Second Substrate
21 Second Insulating Layer
21*a* Frame body
21*b* Support body
22 Second Pad
23 Third Pad
24 Solder Resist
24*a*, 24*b* Opening
25 Connecting part
26 Cavity
27 Direction Changing Part
28 Solder
30 Third Substrate
31 Third Insulating Layer
32 Second Antenna Conductor
33 Fourth Pad
34 Solder Resist
34*a* Opening

The invention claimed is:

1. A wiring substrate comprising:
a first substrate,
a second substrate which is located on one side of the first substrate, comprising a frame body located on an outer circumferential edge of the first substrate, at least two connecting parts connected to an inner circumferential part of the frame body, and a support body connecting the two connecting parts to each other, and
a third substrate which is located on a surface of the second substrate opposite to the first substrate,
wherein the frame body is fixed on the first substrate and the third substrate,
wherein the support body includes a thermosetting resin and a direction changing part which is a bending point between the two connecting parts, and
wherein a space is located between the support body and the first substrate and between the support body and the third substrate.

2. The wiring substrate according to claim 1, wherein the direction changing part is in a curved shape.

3. The wiring substrate according to claim 1, wherein the direction changing part is in a bag shape.

4. The wiring substrate according to claim 1,
wherein the frame body has a pair of sides facing each other,
the two connecting parts are located separately on the pair of sides of the frame body, and
a plurality of the direction changing parts is located between the two connecting parts.

5. The wiring substrate according to claim 1, wherein the first substrate, the second substrate, and the third substrate are electrically connected by an electrical conductor, respectively.

6. The wiring substrate according to claim 1, wherein the second substrate includes a cavity surrounded by the inner circumferential part of the frame and the support body.

7. The wiring substrate according to claim 2,
wherein the frame body has a pair of sides facing each other,
the two connecting parts are located separately on the pair of sides of the frame body, and
a plurality of the direction changing parts is located between the two connecting parts.

8. The wiring substrate according to claim 3,
wherein the frame body has a pair of sides facing each other,
the two connecting parts are located separately on the pair of sides of the frame body, and
a plurality of the direction changing parts is located between the two connecting parts.

9. The wiring substrate according to claim 2, wherein the first substrate, the second substrate, and the third substrate are electrically connected by an electrical conductor, respectively.

10. The wiring substrate according to claim 3, wherein the first substrate, the second substrate, and the third substrate are electrically connected by an electrical conductor, respectively.

11. The wiring substrate according to claim 4, wherein the first substrate, the second substrate, and the third substrate are electrically connected by an electrical conductor, respectively.

12. The wiring substrate according to claim 7, wherein the first substrate, the second substrate, and the third substrate are electrically connected by an electrical conductor, respectively.

13. The wiring substrate according to claim 8, wherein the first substrate, the second substrate, and the third substrate are electrically connected by an electrical conductor, respectively.

14. The wiring substrate according to claim 2, wherein the second substrate includes a cavity surrounded by the inner circumferential part of the frame and the support body.

15. The wiring substrate according to claim 3, wherein the second substrate includes a cavity surrounded by the inner circumferential part of the frame and the support body.

16. The wiring substrate according to claim 4, wherein the second substrate includes a cavity surrounded by the inner circumferential part of the frame and the support body.

17. The wiring substrate according to claim 11, wherein the second substrate includes a cavity surrounded by the inner circumferential part of the frame and the support body.

18. The wiring substrate according to claim 12, wherein the second substrate includes a cavity surrounded by the inner circumferential part of the frame and the support body.

19. The wiring substrate according to claim 13, wherein the second substrate includes a cavity surrounded by the inner circumferential part of the frame and the support body.

* * * * *